United States Patent [19]

Williston

[11] Patent Number: 4,631,111

[45] Date of Patent: Dec. 23, 1986

[54] DICHROMIC PROCESS FOR PREPARATION OF CONDUCTIVE CIRCUIT

[75] Inventor: David W. Williston, Newark, Del.

[73] Assignee: E. I. Du Pont de Nemours and Company, Wilmington, Del.

[21] Appl. No.: 675,229

[22] Filed: Nov. 27, 1984

[51] Int. Cl.[4] .................. B44C 1/22; B29C 17/08; G03C 5/00

[52] U.S. Cl. .................. 156/630; 156/633; 156/644; 156/655; 156/661.1; 430/312; 430/313; 430/315; 430/503; 427/97; 427/98

[58] Field of Search .......... 430/312, 313, 315, 394, 430/502, 503, 508; 156/659.1, 661.1, 644, 652, 655, 668, 902, 630, 633, 235; 427/98, 97, 54.1, 53.1; 174/68.5

[56] References Cited

U.S. PATENT DOCUMENTS

| | | | |
|---|---|---|---|
| 3,751,248 | 8/1973 | Goell | 430/312 |
| 4,411,980 | 10/1983 | Haney et al. | 427/98 X |
| 4,469,777 | 9/1984 | O'Neil | 430/315 |
| 4,572,764 | 2/1986 | Fan | 156/630 |

*Primary Examiner*—Edward Kimlin
*Assistant Examiner*—Ramon R. Hoch

[57] ABSTRACT

Process for preparation of conductive circuit utilizing two photohardenable layers on substrate which may contain a conductive circuit, the upper photohardenable layer becoming hardenable and nontacky when exposed to short wavelengths of radiation (ultraviolet) the lower photohardenable layer being tacky and sensitive to long wavelength radiation (visible light). The photohardenable layers are imagewise exposed through a dichromic phototool (black/yellow also having clear areas) and the unhardened image areas are solvent developed revealing tacky areas. The tacky areas are treated with metal or alloy particles or plating catalyst material, and the metallized or catalyzed image is electrolessly plated. Multilayer conductive circuits can be prepared.

17 Claims, 5 Drawing Figures

FIG. IA
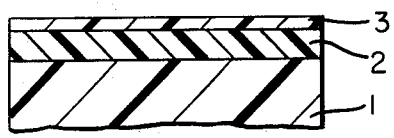
FIG. IB
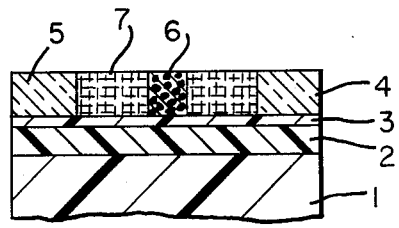
FIG. IC
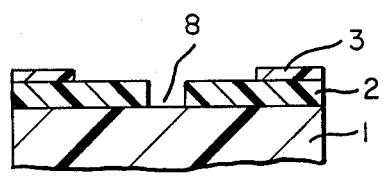
FIG. ID
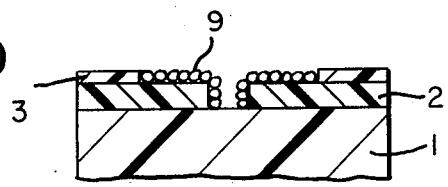
FIG. IE
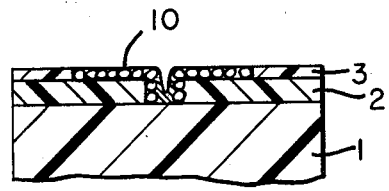

DICHROMIC PROCESS FOR PREPARATION OF CONDUCTIVE CIRCUIT

DESCRIPTION

1. Technical Field

This invention relates to a process for preparation of a conductive circuit. More particularly this invention relates to a process for preparing a conductive circuit by imagewise exposing a two layer photohardenable element through a dichromic phototool.

2. Background Art

Multilayered printed circuit boards have been prepared by using photohardenable films and additive plating processes as described in Peiffer U.S. Pat. Nos. 4,054,479 and 4,054,483. In these processes the conductive interconnections between the layers are produced by predrilling holes and registering the holes with printed circuit patterns. Such predrilling procedures are limited by the inherent inaccuracies of registration to printed circuit patterns where circuit lines are not closely spaced.

Peiffer U.S. Pat. No. 4,157,407 describes a process for preparing printed circuits with electrical interconnections without drilling or punching the requisite hole and without using the time consuming hole chemical catalyzation process of the prior art. Multilayered circuits can be provided by this process which have high packing density with multiple crossovers and interconnections. The process of U.S. Pat. No. 4,157,407, while effective for the preparation of multilayered circuits, requires many repetitive steps in practical use including: two registrations of the image and exposure to actinic radiation; two applications of finely divided metal, including application to the through-holes; two applications of heat; and two removals of excess metal particles, e.g., by water-wash followed by drying.

It is therefor desirable to provide a process for the preparation of multistrate printed circuits by a simplified method which utilizes single imagewise exposure and toning steps wherein it is not necessary to expose through toned areas.

BRIEF DESCRIPTION OF DRAWING

In the accompanying drawing forming a material part of this disclosure FIGS. 1A, 1B, 1C, 1D and 1E are cross sections of a simple two-layer printed circuit at various stages of fabrication in accordance with the invention.

DISCLOSURE OF THE INVENTION

In accordance with this invention there is provided a process for the preparation of a conductive circuit which comprises (a) applying to a substrate two photohardenable layers, the upper photohardenable layer being hardenable and nontacky when exposed to short wavelengths of actinic radiation and the lower photohardenable layer being tacky and hardenable when exposed to longer wavelengths of actinic radiation than the upper layer;

(b) exposing the photohardenable layers to radiation through a dichromic phototool containing one or more areas which transmit visible radiation whereby the lower photohardenable layer becomes hardened but remains tacky, one or more clear areas which transmit visible and ultraviolet radiation whereby the upper and lower photohardenable layers become hardened and areas which mask out all said radiation;

(c) removing the unhardened areas of the upper and lower photohardenable layers with a solvent for the unhardened areas:

(d) applying finely divided metal, alloy or plating catalyst material to the uncovered tacky areas of the lower photohardenable layer; and (e) plating the metallized or catalyzed image to form an electrially conductive circuit.

The process of the invention for preparing a conductive circuit, e.g., two circuit patterns having electrical connections therebetween has at least the following steps:

(a) applying to a substrate or layer, bearing an electrically conductive pattern two photohardenable layers which are more fully described below wherein the upper layer is sensitive to short wavelengths of actinic radiation, ultraviolet radiation, and the lower layer is tacky and is sensitive to longer wavelengths of actinic radiation than the upper layer, e.g., visible light;

(b) exposing the photohardenable layers to visible light and ultraviolet radiation through a dichromic phototool which contains black areas, yellow areas and clear areas, (c) removing the unhardened areas by development with a solvent for the unhardened areas:

(d) applying metal, alloy or plating catalyst material to the tacky areas; and (e) plating the metallized or catalyzed image to form an electrically conductive circuit pattern interconnected with the underlying circuit pattern.

After step (d) any excess metal, alloy or plating catalyst material which adheres in an area other than tacky areas of the lower photohardenable layer and particularly to the hardened areas of the upper photohardenable or surface layer can be physically removed, e.g., by brushing, milling, impinging with water, etc. without affecting the toned tacky areas which are below the surface of the upper photohardened layer. After plating of the image occurs (step (e)) the circuit can be optionally brushed or polished so as to not damage the circuit in the upper layer.

A multilayer printed circuit board having conductive interconnections can be prepared from a printed circuit containing a via and a circuit layer which has been prepared utilizing steps (a) to (e) as described above and any or all of the optional steps and then repeating the required steps as well as any of the optional steps at least once using the newly plated circuit pattern in step (e) for the succeeding process step (a).

The printed circuit substrate employed in the present invention can be any one of the various kinds of sheets, plates, synthetic resin plates, synthetic resin laminated plates, or composites, etc., having the necessary electrical and mechanical properties, chemical resistance, heat resistance etc. Examples of resins include: phenol-formaldehyde, epoxy and melamine resins, etc. Glass plates and ceramic or ceramic coated metal plates are also useful. The substrate can also be a paper, cardboard, fiber, including glass cloth, wooden sheet material or paper base phenolic resin laminate, paper base without resin is particularly useful in producing low-cost printed circuits. Metal sheets can be used provided that the material adhered thereto acts as an insulating barrier between the metal sheet support and the builtup metallized circuit. Also useful are self-supported photohardenable elements as disclosed in Peiffer U.S. Pat. No. 4,054,479. A printed circuit which can contain closely spaced lines is present thereon. The printed circuit can be prepared by standard methods known in the art, e.g., etching of copper on the surface of the substrate or by other methods such as those described in Peiffer U.S. Pat. No. 4,234,626.

To form printed circuit boards with conductive interconnections according to the invention two photohardenable layers are applied to the printed circuit surface. Generally this is done by laminating at a temperature range of 90° to 125° C., preferably 104° to 110° C., the two layers to the printed circuit surface or substrate in one lamination step. The lamination can also be accomplished in two consecutive laminations by laminating the lower tacky photohardenable layer to the substrate or circuit surface followed by laminating the upper photohardenable layer to the lower photohardenable layer. The two step lamination is less preferred primarily since two steps are required. Still less preferred is the application of the photohardenable layers as liquids, e.g., solution suspension, etc., by conventional means, e.g., dip coating, spin coating, coating with a doctor knife, spraying, etc.

The lamination procedure, referred to above, can be a suitable method known in the art, e.g., one described in Celeste U.S. Pat. No. 3,469,982, Collier and Pilette U.S. Pat. No. 3,984,244 and Friel U.S. Pat. No. 4,127,436. These patents are incorporated by reference.

The dry thickness of the bottom photohardenable layers ranges from 0.0015 to 0.002 inch (0.038 to 0.051 mm) and the dry thickness of the top photohardenable layer ranges from 0.0005 to 0.00075 inch (0.013 to 0.019 mm). While both layers are photohardenable and contain usual ingredients for such layers, i.e., monomeric compounds, binders, photoinitiators, as well as other known additives, the lower layer, i.e., one adjacent to the printed circuit surface, is tacky and remains tacky. The upper layer, while it may be soft or tacky to some extent in its original state is hard and nontacky at least in the exposed state. The lower tacky layer is sensitive to visible light and therefore also contains at least one sensitizer which absorbs light in the 400 to 520 nm region of the spectrum, preferably 460 to 480 nm, as well as a tacky material or tackifier to provide tack. Tackifying resins, preferably polyterpene resins are useful in providing permanent tack to the lower layer; Wingtack Plus ®, a proprietary resin manufactured by Goodyear Tire and Rubber Co., Akron, Ohio, is particularly useful. Gums or other classes of tackifying materials known to those skilled in the art may also be employed. The upper layer which is sensitive to ultraviolet radiation and relatively insensitive to visible light contains at least one compound that is sensitive in the ultraviolet region of the spectrum. The upper photohardenable layer typically is a conventional photoresist formulation such as those disclosed in Celeste U.S. Pat. No. 3,469,982. The lower tack, photohardenable layer typically is a photopolymerizable composition containing an elastomeric binder such as those disclosed in Haney and Lott U.S. Pat. No. 4,411,980, a tackifying agent, and/or excess plasticizing agents. The above two patents are incorporated by reference.

The photohardenable layers are prepared by mixing the ingredients in a suitable solvent or solvent mixture, e.g., methylene chloride, methyl ethyl ketone, ethyl Cellosolve ®, etc. Alcohols, e.g., methanol, ethanol, etc., can be present in the solvent combination. The tackifier and sensitizers may be added subsequently to other ingredients, and the composition is thoroughly mixed, e.g., as described in Example 1 below. The composition is then coated on a support film, e.g., polyethylene terephthalate or other plastic film, using standard coating techniques, e.g., doctor knife, spin coater, etc. The film is subsequently dried, generally at an elevated temperature of 45° to 95° C., preferably 50° to 55° C. A polyethylene cover sheet or other known cover sheet is laminated to the free surface generally at room temperature to form a photohardenable element. Both the cover sheet and support film are removable without damage to the photohardenable layer. In use, the cover sheet is removed from the tacky element, and the element is laminated to a substrate or a circuit on a printed circuit board. The film support is then removed, and the upper photohardenable element from which the cover sheet had been removed is laminated to the tacky photohardenable layer. As mentioned above, a 2-layer element can be prepared and therefore only one lamination step is required.

Once the photohardenable layers are present on the circuit board surface, the layers are exposed imagewise through a dichromic or two color (black/yellow) mask to a source of ultraviolet radiation as well as visible light. The black areas of the mask have sufficient optical density to be opaque to any such radiation. The clear areas of the dichromic mask are transparent to both ultraviolet radiation and visible light. The dichromic mask may be prepared by standard color development processes like those used to make subtractive color films, e.g., Kodachrome ®, registered trademark of Eastman Kodak Company, Rochester, N.Y. Color development of suitable films is described in Chapter 12, "The Theory of the Photographic Process", Fourth Edition, edited by T. H. James, The Macmillan Company, New York, N.Y. (1977).

Upon exposure, the lower photohardenable layer becomes polymerized except where the radiation is masked by a black image, and the upper photohardenable layer is polymerized except where the radiation is masked by a black or yellow image. Less preferably the layers may be exposed to a black/clear pattern incorporating layer to layer interconnects through a Wratten ® No. 4 filter, then to a black/clear interconnect circuit pattern using unfiltered light. Suitable ultraviolet radiation sources are disclosed in Plambeck U.S. Pat. No. 2,760,863, Chu and Cohen U.S. Pat. No. 3,649,268 and Peiffer U.S. Pat. No. 4,157,407, the disclosures of which are incorporated by reference. For visible light exposure a Berkey Ascor Vacuum Printer incorporating an extended range lamp (part no. 1406-02) is particularly useful. Other sources emitting the wavelengths of interest 360 nm and 400–520 nm may be used.

Subsequent to the imagewise exposure the unhardened areas of the upper and lower photohardenable layers are removed with a suitable solvent for the particular photohardenable compositions used. 1,1,1-Trichloroethylene is the preferred solvent. Additional solvents may be added to modify development time or change development latitude, e.g., isopropanol, ethanol, methanol, Carbitol ®, Cellosolve ®, or heptane. Other solvents will be known to those skilled in the art. The removal of the unhardened portion of the photohardenable layers is accomplished by known techniques, e.g., in developing apparatus, impinging of solvent, etc. aided by light mechanical action in some cases. The unhardened areas of both layers corresponding to the black areas of the phototool are removed forming holes or the areas where the vias are formed. The unhardened areas of the upper photohardenable layer corresponding to the yellow areas of the phototool are also removed forming grooves where the circuit lines are formed. No photohardened material is removed in the areas corresponding to the clear areas of the phototool.

Metal particles, alloy particles or plating catalyst are applied to the tacky areas formed by the development step as well as the nontacky areas. Where the photohardenable material in both layers is removed down to the circuit bearing substrate (black areas of the phototool) the edges of the lower photohardenable layer are tacky. Where solely the photohardenable material in the upper photohardenable layer is removed areas of the tacky lower photohardenable layer are exposed (yellow areas of the phototool). The metal particles, alloy particles or plating catalyst will adhere to the tacky areas but not adhere to the photohardened areas of the upper layer (clear areas of the phototool).

Suitable particles that can be subsequently electrolessly plated, or soldered as known in the art include: copper, tin, lead, solder, mixtures of copper and solder, copper-tin alloy, tin-lead alloy, aluminum, gold, silver; metal oxides such as titanous oxide, copper oxide, etc. Also useful are metal coated particles, e.g., silver coated glass. The particles have an average diameter of 0.5 to 250 μm, preferably 1 to 25 μm in average diameter. Copper powder is preferred.

The particles can be applied by known methods including, but not limited to, the toning methods described in Berg and Cohen U.S. Pat. No. 3,060,024, Chu and Cohen U.S. Pat. No. 3,649,268, and Tobias U.S. Pat. No. 4,069,791. It is also possible to apply the particles by use of a fluidized bed of particles as described in Research Disclosure, June 1977, No. 15882 by Peiffer and Woodruff. If necessary, any excess metal, alloy or plating catalyst particles are removed from the nonadherent image areas. Suitable mechanical and other means for accomplishing this are described in the above-identified U.S. Patents and the Research Disclosure, the disclosures of which are incorporated by reference.

Electroless plating procedures are known to those skilled in the art, e.g., U.S. Pat. No. 4,054,483 which is incorporated by reference. Electroless plating baths are commercially available, e.g., from the Shipley Company, Revere, MA, Kollmorgen Corp., Glen Cove, N.Y., and other sources. Such baths may have to be modified to insure that the metal-bearing flexible element is maintained in the bath for a sufficient period of time, e.g., 1 to 6 hours, preferably 1 to 4 hours. Useful electroless plating solutions are described in Zeblisky et al., U.S. Pat. No. 3,095,309, particularly Example II, which is incorporated by reference. The temperature of the electroless plating bath can range from 43° to 85° C., preferably 53° C. It may be desirable after plating to brush or polish the circuit layer to remove any dirt or deposits from the dielectric areas and provide a smooth, even surface for lamination of a subsequent circuit layer, without disturbing the integrity of the metallized circuit lines.

A preferred embodiment of the invention is illustrated in Example 1 below.

INDUSTRIAL APPLICABILITY

The process of the invention enables two or more layered printed circuits with electrical interconnections to be prepared without drilling or punching the requisite hole and without chemical catalyzation of the through-holes which is time consuming. The process is simpler than those in general use and eliminates the necessity of repetitive steps in the preparation of a single conductive layer. The process is useful with exposures through two different black and clear photomasks but is less preferred.

In the process of the invention imagewise tack development does not depend on differential tack developed by polymerization of photohardenable layers but on the permanent tackiness of the composition of the lower photohardenable layer and the nontacky nature of the exposed upper photohardenable layer. The relative solubility of the two photohardenable layers in the developing solvent is determined by the imagewise photohardening. Subsequent development determines whether tacky areas, nontacky areas or the substrate or circuit below will be exposed and ready for toning of tacky areas. Since the tackiness is independent of the photohardening, desirable properties, such as thermosetting adhesion, can be incorporated into the dielectric layers without affecting or altering the photosystem. In contrast to known toning-plating procedures, the geometry of the plated vias and circuit lines is determined by the photo-defined shape of the grooves and via holes, rather than by the size and placement of the toned particles. Therefore, larger particles may be used without affecting the sharpness of the circuit lines, simplifying the plating and decreasing the amount of particles applied to the noncircuit areas.

Other advantages of the circuit prepared by the process of this invention over circuits prepared by applying metal particles to the surface thereof are:

1. Adhesion of the circuit lines is superior to that of surface-mounted additive circuits because the metal or other particles is deposited within and mechanically applied to the dielectric layer.
2. There is no cumulative buildup of circuit thickness as layers are added to the circuit because the circuit lines are in the dielectric layers, and layer-to-layer spacing of circuit lines can be controlled precisely by controlling the thickness of the dielectric layer. Lamination to a smooth surface improves the adhesion and decreases the inclusion of air bubbles or other defects in the laminated layer.
3. The circuit lines will not spread during plating because plating action is confined. There is also a large decrease in the amount of shorting since the plating is defined by circuit walls. Sharper circuit lines with higher aspect ratios and greater current carrying capacity than surface plated lines of the same width can be obtained. This results in the preparation of higher resolution circuits with more devices per unit of circuit surface.

EXAMPLES

The following examples illustrate the invention wherein the parts and percentages are by weight. The $\overline{M}n$ (no. ave. mol. wt.) and $\overline{M}w$ (wt. ave. mol. wt.) values for the polymers are determined by gel permeation chromatography using polymeric standards as known to those skilled in the art.

EXAMPLE 1

A two layer dichromic dielectric film is prepared as follows:

The following ingredients are mixed as set forth below to prepare a composition for forming the bottom photohardenable layer of the film which is sensitive to visible light.

| Bottom Photohardenable Layer | |
|---|---|
| Ingredient | Amount (parts) |
| (A) | |
| Bis(2-o-chlorophenyl-4,5-diphenylimidazole | 0.477 |
| Tri(p-N,N—dimethylaminophenyl)methane | 0.026 |
| Tri(2-methyl-4-N,N—diethylaminophenyl)-methane | 0.038 |
| Green pigment[1] | 0.031 |
| Benzotriazole | 0.052 |
| Styrene copolymer[2] | 1.55 |
| Triethylene glycol dimethacrylate | 3.40 |
| Di-(3-acryloxy-2-hydroxypropyl)-ether of bisphenol-A | 3.40 |
| Benzophenone | 1.026 |
| N—phenyl glycine | 0.120 |
| Methylene chloride | 22.210 |
| Methanol | 1.168 |
| (B) | |
| Polystyrene-polyisoprene-polystyrene block copolymer, Kraton ® 1107, Shell Chemical Co., Polymers Division, Houston, Texas | 5.974 |
| Methylene chloride | 23.933 |
| (C) | |
| Poly(methylmethacrylate(34)/acrylonitrile(8)/butadiene(16)/styrene(42)interpolymer | 5.974 |
| Methylene chloride | 23.933 |
| Wingtack Plus ® polyterpene Tackifying Resin, Goodyear Chemical Co., Akron, Ohio | 4.787 |
| Polymeric sensitizer[3] | 1.915 |

[1]Victoria Green C.I. Pigment Green 18 (pigment 30%) rollmill blended with methyl methacrylate(34)/styrene(42)/acrylonitrile(8)/butadiene(16) interpolymer
[2]α-methyl styrene/vinyl toluene resin (softening point 100° C., refractive index 1.583, viscosity at 25° C. for a 65% solution in toluene is 1.6–1.9 poises, manufactured by Hercules, Inc., Wilmington, DE)
[3]Terpolymer of methyl acrylate, methyl methacrylate and a dye incorporating, in random order, 11.4% methyl acrylate, 82.9% methyl methacrylate, and 5.7% dye, of the formula:

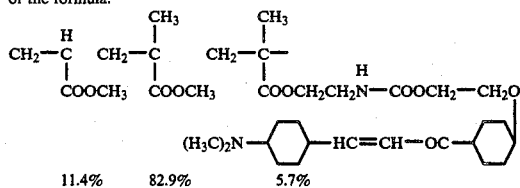

wherein $\overline{M}w$ is 181.000, $\overline{M}n$ is 22,000

To prepare 100 g of solution:

Prepare solutions (A), (B) and (C), as noted above, by dissolving the solutes in the solvents with agitation. Add the tackifying resin and the polymeric sensitizer, and roll on a jar roller in a 4-oz (11.34 g) bottle filled one third full with 0.125 inch (ca. 3.18 mm diameter) diameter stainless steel balls for 16 hours. The mixed composition is coated on a polyethylene terephthalate film, 0.0001 inch (0.0025 mm) in thickness, treated on the coated side with 16,250 release Custom Coating and Laminating Corp., Worcester, MA, by means of a 0.013 inch (0.33 mm) doctor knife at a speed of 6 feet/minute (1.83 m/minute) and is dried at 120° F. (49° C.) to form a dry layer, 0.0015 inch (0.038 mm) in thickness. A polyethylene terephthalate cover sheet having a releasable layer of polydimethyl siloxane coated thereon to give a coating weight of about 125 mg/dm² when dried is laminated on the photohardenable layer at 40 p.s.i. (2.81 kg/cm²) and room temperature.

The following ingredients are mixed as set forth below to prepare a composition for forming the top photohardenable layer of the film which is sensitive to ultraviolet radiation.

| Top Photohardenable Layer | |
|---|---|
| Methyl methacrylate polymer of the formula —[CH$_2$—C(CH$_3$)COOCH$_3$]n where n is 400; inherent viscosity of 0.20–0.22 for a solution of 0.25 g in 50 ml chloroform, at 25° C. using a No. 50 Cannon-Fenske viscometer; Brookfield viscosity of 700–1,400 at 25° C. for a solution in toluene which contains 37.5 wt. percent; density 1.19 g/cc. | 8.038 |
| Methyl methacrylate polymer of the formula shown above wherein the Mw is about 200,000: inherent viscosity of 1.25–1.50 determined under same conditions as the above polymer; Brookfield viscosity of 900–1,850 determined under same conditions as the above polymer except the solution contains 17.5 wt. percent; density 1.20 g/cc. | 6.493 |
| Trimethylolpropane trimethacrylate | 8.012 |
| 4-Morpholinobenzophenone | 0.141 |
| Tri(2-methyl-4-N,N—diethylaminophenyl)methane | 0.088 |
| Leuco Crystal Violet | 0.026 |
| Green pigment used in bottom photohardenable layer | 0.011 |
| Dioctyl phthalate | 2.387 |
| Triethyleneglycol diacetate | 1.188 |
| 4,4′-dichlorobenzophenone | 1.105 |
| N—phenyl glycine | 0.141 |
| Methylene chloride | 66.517 |
| Methanol | 5.839 |

To prepare 100 g of solution:

Dissolve the ingredients in the mixed solvent by rolling for 16 hours in a 4-oz (113.4 g) bottle filled one third full with 0.125 inch (ca. 3.18 mm) diameter stainless steel balls. The mixed composition is coated on a polyethylene terephthalate film, 0.0001 inch (0.0025 mm) in thickness, by means of a 0 004 inch (0.10 mm) doctor knife at 6 feet/minute (1.83 m/minute) and is dried at 120° C. to form a dry layer, 0.0005 inch (0.013 mm) in thickness. A polyethylene cover sheet is laminated on the photohardenable layer at 40 p.s.i. (2.81 kg/cm²) and 180° F. (77° C.) roll temperature.

The cover sheet on the bottom photohardenable layer is removed and the layer is laminated to a substrate which may be a material having the required mechanical properties and adequate electrical resistivity, e.g., phenolic circuit board, epoxy glass circuit board, etc. Alternatively the bottom photohardenable layer may be laminated to a previously prepared circuit layer containing vias and circuit lines which may be prepared by the process of the invention or by other processes, e.g., print and etch processes wherein a resist is applied to a copper sheet and the unwanted copper is removed by chemical etching; additive processes wherein copper or a catalyst is applied imagewise and is electrolessly plated to form a circuit; or printing processes wherein conductive ink is applied, by screen printing, etc. The polyethylene terephthalate film is then removed and after removing the cover sheet from the top photohardenable layer this layer is laminated to the bottom layer at about 20° C. The laminate is shown in FIG. 1A wherein the substrate (bearing a printed circuit), lower photohardenable layer and upper photohardenable layer are designated 1, 2 and 3 respectively. A phototool (4 in FIG. 1B) having clear (5 in FIG. 1B), opaque (6 in FIG. 1B) and yellow (7 in FIG. 1B) image areas which correspond, respectively, to dielectric areas, vias, and circuit areas in the desired circuit is placed on the upper photohardenable layer and the two-layer film is exposed to an ultraviolet radiation-visible light source, a Berkey Ascor vacuum printer with a No. 1406-02 ultraviolet/visible lamp. The film is exposed to about 100 units of light using the light energy integrator supplied with the equipment. The value may vary from printer to printer. After the phototool is removed, the unhardened areas of the film are removed by spraying with 1,1,1-trichloroethylene solvent. The dielectric layers after removal of the unhardened areas contain areas where the entire two layers have been removed (vias will be generated), areas where the upper layer only have been removed (circuit lines will be generated), and areas where the two layers are intact (noncircuit areas). This is illustrated in FIG. 1C wherein a via is designated 8. To the tacky areas copper powder (9 in FIG. 1D), about 1 μm average particle size, is applied by flowing the powder across the surface. The copper powder falls into the grooves and via holes, coating the tacky bottom of the circuit lines and edges of the via holes as shown in FIG. 1D. The toned surface is degreased by washing with warm soapy solution of pH about 9 followed by a warm water rinse, and the toned element is allowed to cool. The toned element is immersed for 15 seconds into 1% sulfuric acid solution, followed by a rinse in a water tank and a distilled water tank each for 30 seconds. The rinsed toned element is placed immediately into a copper electroless plating bath purchased from photocircuits Kollmorgen, Glen Cove, N.Y. designated PCK AP-480 (referred to as additive plating bath 480, electroless copper addition technology) and maintained in the plating bath for 2 hours. After electroless plating the circuit layer (10 in FIG. 1E) is brushed or polished to remove any dirt or deposits from dielectric areas, and provide a smooth even surface for the next circuit layer, if one is used, without disturbing the integrity of the copper lines in the circuit grooves. This is illustrated in FIG. 1E. A useful two-layer printed circuit is obtained by connecting the original printed circuit on substrate 1 with the new circuit.

EXAMPLE 2

Example 1 is repeated except that in place of the phototool having clear, opaque and yellow image areas the dielectric film undergoes two exposures through two different black and clear phototools. After the lamination to a substrate, or to a previously prepared circuit layer, the film is exposed through a phototool having black and clear image areas wherein the vias are masked. The film is exposed to visible light for about 50 units (about 2.3 minutes) using a Berkey Ascor Vacuum printer with an extended range lamp fitted with a Wratten® No. 4 filter, trademark Eastman Kodak Co., Rochester, N.Y., between the service and phototool. The second exposure is to ultraviolet and visible radiation using the same printer as described above without the filter through a phototool having black and clear image areas wherein the via and circuit lines are masked. The second phototool is placed in registration with the first phototool. The two-layer printed circuit obtained after development, toning with copper powder and electroless plating as described in Example 1 is similar to that described in Example 1.

I claim:

1. A process for the preparation of a conductive circuit which comprises
   (a) applying to a substrate two photohardenable layers, the upper photohardenable layer being sensitive to ultraviolet radiation and relatively insensitive to visible radiation and being hardenable and nontacky when exposed to short wavelength ultraviolet actinic radiation but unhardenable when exposed to longer wavelength visible radiation, and the lower photohardenable layer being tacky and hardenable when exposed to the longer wavelength visible actinic radiation;
   (b) exposing the photohardenable layers to radiation containing ultraviolet and visible radiation through a dichromic phototool containing one or more areas characteristic of a circuit pattern which transmit visible radiation and masks out ultraviolet radiation whereby the lower photohardenable layer becomes hardened but remains tacky and the upper photohardenable layer remains unhardened, one or more clear areas which transmit visible and ultraviolet radiation whereby the upper and lower photohardenable layers become hardened, and areas characteristic of vias of the circuit pattern which mask out all said radiation;
   (c) removing with a solvent the unhardened areas of the upper photohardenable layer to uncover the exposed tacky areas of the lower photohardenable layer corresponding to the circuit pattern and removing unhardened areas of the unexposed lower photohardenable layer forming holes corresponding to the vias;
   (d) applying finely divided metal, alloy or plating catalyst material to the uncovered tacky circuit areas and edges of the via holes of the lower photohardenable layer; and
   (e) plating the metallized or catalyzed image to form an electrically conductive circuit.

2. A process for preparing a multilayer conductive circuit having conductive interconnections which comprises preparing a printed circuit according to claim 1 and then repeating steps (a) to (e) at least once using the newly plated circuit pattern in step (e) for the succeeding process step (a).

3. A process according to claim 1 wherein the lower photohardenable layer contains a polymeric sensitizer which absorbs light in the 400 to 520 nm region of the spectrum.

4. A process according to claim 1 wherein the two photohardenable layers are applied to the substrate by lamination at a range of 90° to 125° C.

5. A process according to claim 4 wherein the two photohardenable layers are applied to the substrate in one lamination step.

6. A process according to claim 4 wherein the two photohardenable layers are applied in two consecutive laminations, the lower photohardenable layer being laminated to the substrate and the upper photohardenable layer to the lower photohardenable layer.

7. A process according to claim 1 wherein the photohardenable layers are imagewise exposed to radiation through a dichromic phototool having black and yellow images.

8. A process according to claim 1 wherein the finely divided metal is metal particles 0.5 to 25 μm in average diameter.

9. A process according to claim 8 wherein the metal particles are copper.

10. A process according to claim 1 wherein after the metal, alloy or plating catalyst is applied any excess is removed from the nontacky image areas.

11. A process according to claim 1 wherein after plating the circuit is brushed or polished.

12. A process according to claim 1 wherein the lower photohardenable layer contains an additive which renders it permanently tacky.

13. A process according to claim 12 wherein the tackifying additive is a polyterpene resin.

14. A process according to claim 12 wherein the tackifying additive is a gum material.

15. A process according to claim 1 wherein the exposure of the photohardenable layers to actinic radiation through the dichromic phototool is a composite exposure of the layers sequentially and in register through two black/clear photomasks wherein imagewise exposure through one photomask is to only visible radiation and imagewise exposure through the second photomask is to ultraviolet and visible radiation.

16. A process according to claim 15 wherein exposure through the one photomask is to visible light of the radiation transmitted by a filter and exposure through the second photomask is to unfiltered light of the radiation.

17. A process according to claim 15 wherein the first photomask contains image areas wherein vias are masked and the second photomask contains image areas wherein the vias and circuit lines are masked.

* * * * *